United States Patent [19]

White et al.

[11] 4,056,803
[45] Nov. 1, 1977

[54] METHOD AND APPARATUS FOR EXTRACTING DERIVATIVES FROM SURFACE ACOUSTIC WAVES

[75] Inventors: Richard Manning White, Berkeley; Tzu-Hwa Hsu, San Jose, both of Calif.

[73] Assignee: The Regents of the University of California, Berkeley, Calif.

[21] Appl. No.: 632,134

[22] Filed: Nov. 14, 1975

[51] Int. Cl.$^2$ .................................................. H04B 11/00
[52] U.S. Cl. ...................................... 340/15; 333/30 R; 333/19; 310/313
[58] Field of Search ................. 340/15; 333/72, 30 R, 333/19; 310/9.8; 235/183

[56] References Cited

U.S. PATENT DOCUMENTS

| | | | |
|---|---|---|---|
| 3,551,837 | 12/1970 | Speiser et al. | 333/30 R |
| 3,701,147 | 11/1972 | Whitehouse | 333/30 R |
| 3,770,949 | 11/1973 | Whitehouse et al. | 333/30 R |
| 3,879,673 | 4/1975 | Shaw | 333/30 R |
| 3,936,751 | 2/1976 | Holmes et al. | 333/30 R |

Primary Examiner—Maynard R. Wilbur
Assistant Examiner—T. M. Blum
Attorney, Agent, or Firm—L. Lee Humphries; Craig O. Malin

[57] ABSTRACT

An interdigital electrode transducer mounted on an acoustic surface wave propagating medium having an output proportional to an Nth order derivative of the surface acoustic waves propagating in the medium. The Nth order derivative, where N is any real, positive number, is obtained by using a finite difference approximation. The transducer finger pairs are biphase coded and amplitude weighted in order to detect the proper combination of signal differences for the approximation and thereby indicate the desired derivative.

8 Claims, 13 Drawing Figures

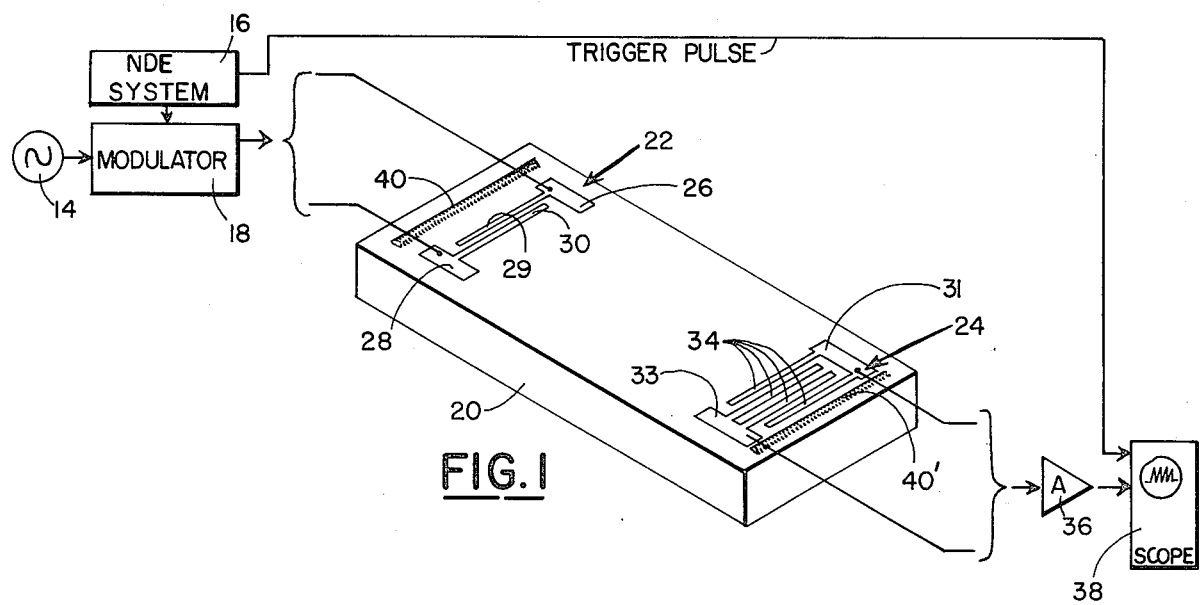
FIG.1
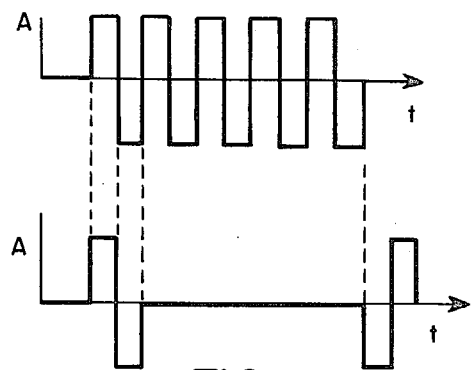
FIG.2
FIG.3
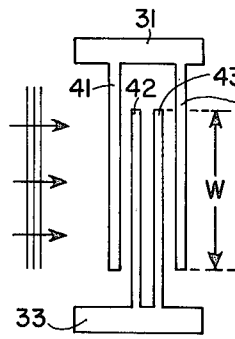
FIRST DERIVATIVE TRANSDUCER
FIG.4
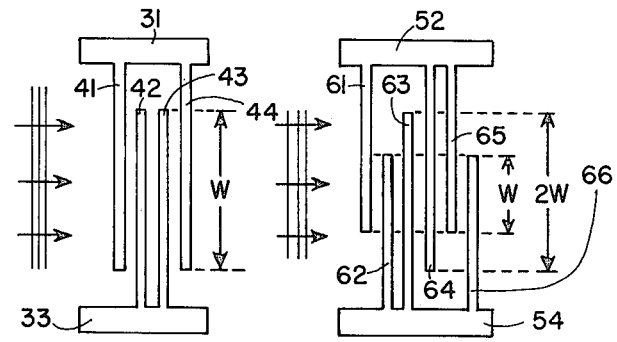
SECOND DERIVATIVE TRANSDUCER
FIG.5
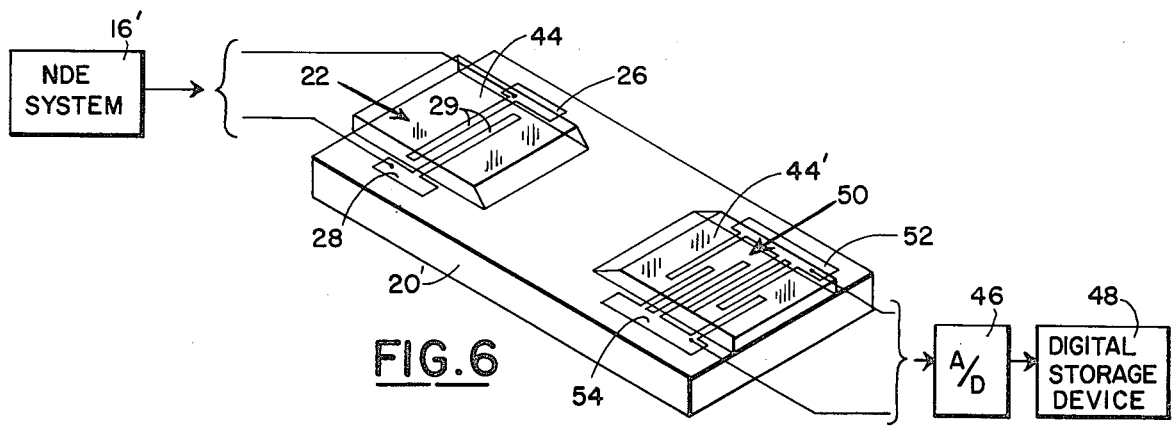
FIG.6

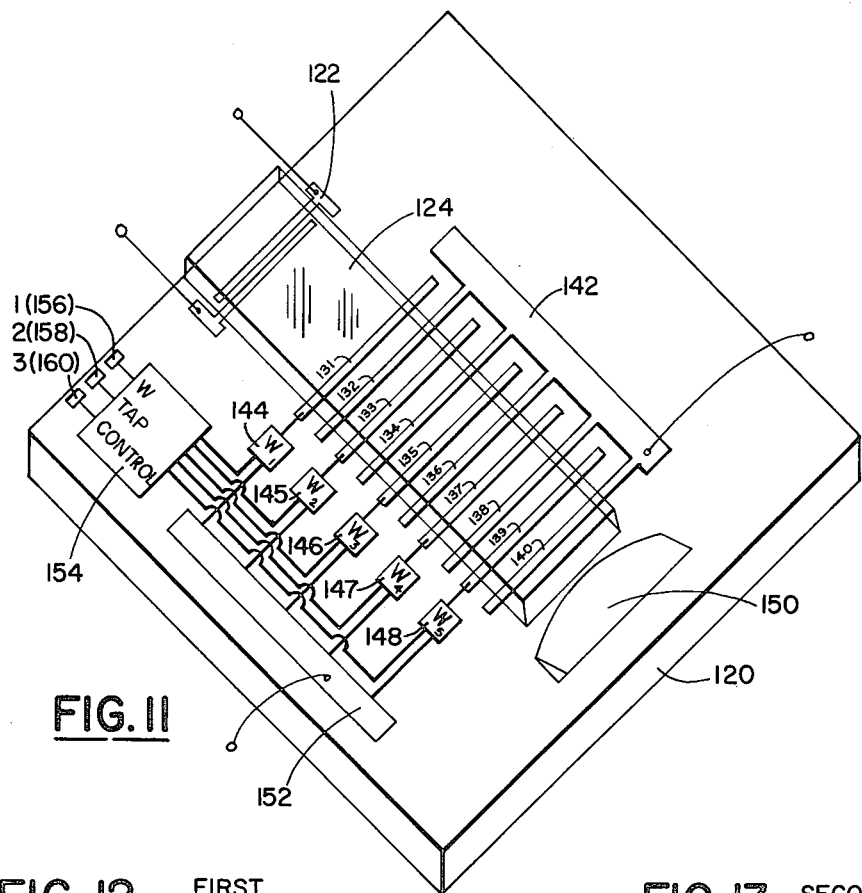
FIG. 11
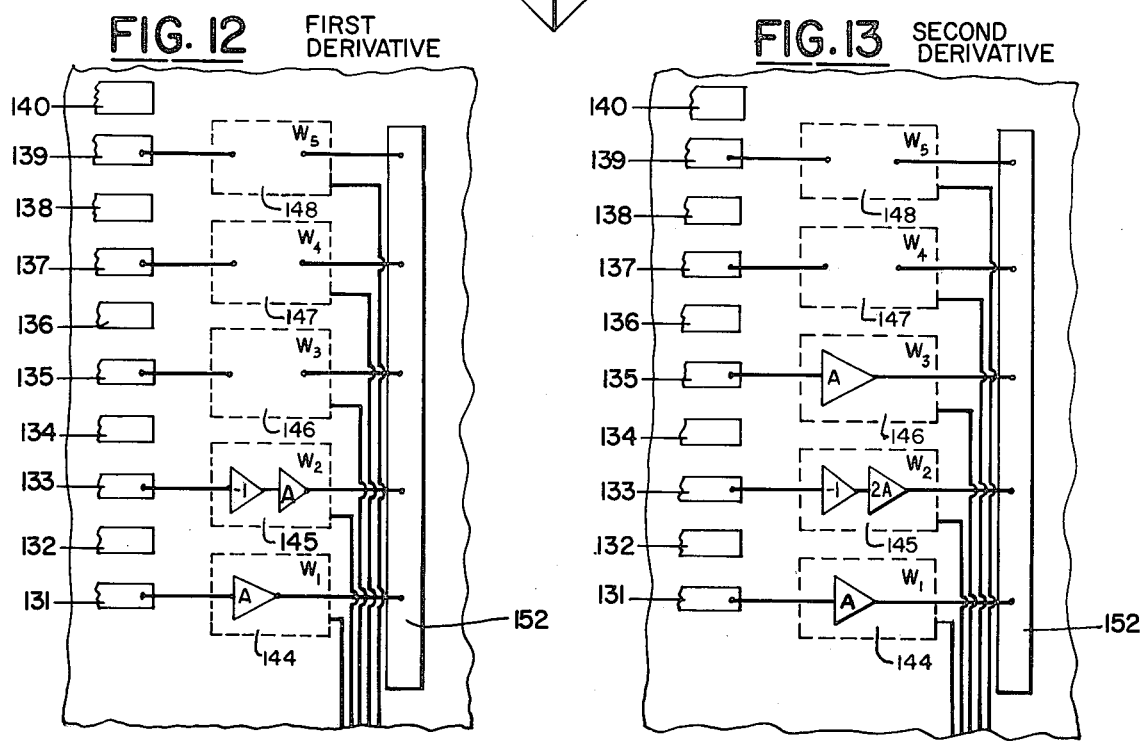
FIG. 12 FIRST DERIVATIVE
FIG. 13 SECOND DERIVATIVE

METHOD AND APPARATUS FOR EXTRACTING DERIVATIVES FROM SURFACE ACOUSTIC WAVES

GOVERNMENT CONTRACT

The invention herein described was made under Government contract with the United States Department of the Army.

BACKGROUND OF THE INVENTION

1. Field of the Invention

The present invention generally relates to acoustic surface wave apparatus and, more particularly, to the transducers used in those applications.

2. Description of the Prior Art

There are many systems in use today that encode data in surface acoustic waves. For example, in the field of nondestructive material evaluation acoustic waves are commonly propagated through various materials in order to detect manufacturing defects, cracks, and flaws. The defect or nonhomogeneous area in the material appears as a change or modulation of the acoustic waves. The position and size of the defect as indicated by the change is thus encoded into the acoustic waves. The defect in the material is discovered and evaluated by locating and measuring these changes. Data is also encoded into surface waves by acoustic imaging systems. In these systems the waves carry an acoustic picture of the object of interest and the encoded data contain information on the contrast of the picture.

In all of the systems where data are encoded into surface acoustic waves the waves are seldom processed to obtain a first and second order derivative information. Most commonly the data is displayed as received and no conversion or processing is performed. Any changes are noted by visually observing the signal as it is displayed on an oscilloscope.

If derivative information is required from surface acoustic waves, then an operational-amplifier differentiator is most commonly used. The surface acoustic waves are first converted into analog electrical signals and then an operational-amplifier network electrically performs the desired differentiation.

It should be noted that an operational-amplifier differentiator cannot directly convert the acoustic waves into derivative signals. In addition, such a differentiator requires subsequent demodulation in order to yield an output signal proportional to the derivative of the envelope of an input function. For example, for an amplitude modulated input signal $A(t) \sin \omega t$, the output of an operational-amplifier differentiator contains two terms $A'(t) \sin \omega t + [A(t) \omega] \cos \omega t$. In order to obtain an output proportional to only the derivative of the envelope $A'(t)$, further demodulation is required. Further, operational-amplifier differentiators fabricated from semiconductors have the problem of saturation and signal distortion when operated at high voltage levels. Also, it should be noted that present operational-amplifiers have a maximum operating frequency of approximately 100 MHz. This upper frequency threshold presents problems when high information storage density is required.

SUMMARY OF THE INVENTION

The present invention is directed to a method and apparatus for directly extracting derivatives from surface propagating acoustic waves. The derivatives of first, second and higher order are extracted by using an electrode transducer having biphase coded and amplitude weighted finger pairs. These finger pairs permit obtaining directly electrical output signals proportional to the finite difference approximation of the desired derivative. The present invention also includes an electrode transducer having commandable biphase coding and amplitude weighting.

It is an object of the present invention to provide a novel method and apparatus that overcomes the limitations and disadvantages of the prior art.

A further object of the present invention is to directly obtain derivatives of any order from surface propagating acoustic waves without converting the acoustic waves into electrical signals first.

An additional object of the present invention is to minimize information storage by providing derivative information rather than the actual signals so that an observer can focus on the information content within the signals instead of the entire signal.

A further object of the present invention is to provide a high frequency differentiator that can process signals having a frequency of at least 1 gigahertz.

Still another object of the present invention is to provide a linear differentiator that does not saturate or distort signals when operated at high input voltage levels.

In addition, an object of the present invention is to provide a signal differentiator which is a distributed device that samples the input signal and produces no output for a constant input.

A further object of the present invention is to differentiate acoustic surface waves in real time and thereby eliminate the need for data storage and subsequent processing.

Additional objects and features of the invention will appear from the following description in which the preferred embodiment has been set forth in detail in conjunction with the accompanying drawings.

BRIEF DESCRIPTION OF THE DRAWINGS

FIG. 1 is a schematic orthogonal view of an acoustic surface wave apparatus having a transducer that provides an output proportional to the first derivative of the surface acoustic waves propagated therein;

FIG. 2 is a graph of an assumed input acoustic waveform;

FIG. 3 is a graph of the output waveform obtained from the apparatus of FIG. 1 when the waveform of FIG. 2 is the input;

FIG. 4 is a plan view of the first derivative transducer illustrated in FIG. 1;

FIG. 5 is a plan view of a transducer for obtaining the second derivative of the acoustic waves incident thereon;

FIG. 6 is a schematic, orthogonal view of an acoustic surface wave apparatus having the second derivative transducer of FIG. 5;

FIG. 11 is a schematic, orthogonal view of an acoustic surface wave apparatus having a transducer which provides on command either the first, second or Nth derivative of the incident acoustic wave;

FIG. 12 is a plan view, partially cut away, of the acoustic surface wave apparatus of FIG. 11 illustrating the weighting networks which provide the first derivative of the input acoustic wave; and FIG. 13 is a plan view, partially cut away, of the acoustic surface wave apparatus of FIG. 11 illustrating the weighting networks which provide the second derivative of the input acoustic surface wave.

DESCRIPTION OF THE PREFERRED EMBODIMENTS

Figure 7:
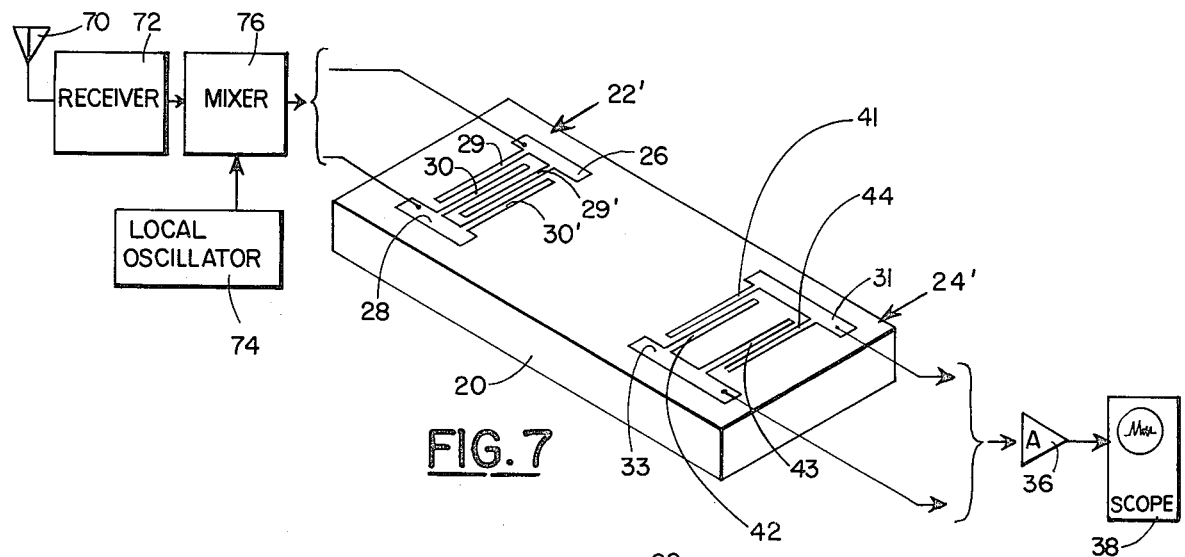
FIG. 7 is a schematic, orthogonal view of an acoustic surface wave apparatus having a first derivative transducer whose finger pairs are separated by more than one acoustic wavelength.

FIG. 1 illustrates an apparatus for extracting the first derivative from propagating surface acoustic waves. The surface acoustic waves originate from electrical input signals obtained from a nondestructive material evaluation system. The electrical output signals from the apparatus are amplified and visually displayed on an oscilloscope.

More particularly, the apparatus of FIG. 1 includes a continuous wave, RF signal generator 14. In the preferred embodiment the signal generator is a commercially available unit that operates at a selectable, constant frequency of either 1, 2.25 MHz, 5.0 or 10 MHz.

In FIG. 1 the input data for the apparatus is provided by a nondestructive material evaluation (NDE) system 16. This NDE system is a data acquisition means. Nondestructive material evaluation systems typically include a bulk wave that is propagated through the material being evaluated. Any defect or nonhomogeneous area in the material modulates the acoustic wave in a different manner than the homogeneous material. Depending on whether the system is operating in a transmission or a reflection mode the wave either passes through or is reflected in the material. The acoustic waves are thereafter converted into electrical signals by either the transmitting transducer (reflection mode) or a second transducer (transmission mode).

The signal generator 14, FIG. 1 and the nondestructive evaluation system 16 are both connected to a standard, commercially available crystal modulator. The modulator varies the RF signal obtained from the signal generator 14 in accordance with the electrical signals obtained from the nondestructive evaluation system. The modulator and the signal generator 14 are selected to provide electrical signals to the acoustic surface wave apparatus that have an operating frequency range compatible with its dimensions. It should be appreciated that the present invention contemplates application over a range of frequencies up to and beyond at least one gigahertz and down to a lower frequency determined only by physical size. Within this range each transducer electrode has an optimum operating frequency range determined by its physical size and spacing.

The apparatus of FIG. 1 also includes a surface acoustic wave propagating medium 20. In the preferred embodiment the propagating medium is a piezoelectric crystal fabricated from a material such as lithium niobate (LiNbO$_3$) or a ferroelectric ceramic material such as PZT. It has been observed that at high frequencies lithium niobate is preferable and at lower frequencies (10 to 30 MHz) PZT performs satisfactorily. There is located an input interdigital electrode transducer 22 at one end of the surface acoustic wave propagating medium. To its left is situated an acoustic absorber 40 to absorb acoustic waves transmitted to the left and so prevent their reflection at the margin of medium 20. In addition, at the opposite end of the medium 20 is located a receiving interdigital electrode transducer 24 with an acoustic absorber 40' beyond it.

Each electrode transducer 22, 24, FIG. 1 is fabricated and attached to the acoustic wave propagating medium 20 by photolithography. In the fabrication process a photographic mask is made having a pattern in the shape of the electrodes ultimately to be produced. A photographic emulsion is placed on the surface of the propagating medium and then the emulsion is exposed to light through the mask. The emulsion is thereafter photographically developed. Next, the emulsion is removed from the surface of the medium at locations where the electrodes are to be located. Thereafter a metal film is vapor deposited onto the medium and the remaining emulsion. Next, the photoemulsion is completely removed from the medium leaving behind the vapor deposited metal film in the shape of the desired transducer electrodes. In the preferred embodiment, both transducer electrodes 22, 24 are fabricated at the same time from the same material. The electrodes can be fabricated from such materials as aluminum or a very thin layer of chromium surmounted by a thicker coating of gold.

The two electrode transducers 22, 24, FIG. 1 each include two parallel bus bars located opposite to each other. Each bus bar has a longitudinal axis parallel to the direction of propagation of the acoustic waves. Each transducer electrode further includes a plurality of electrode fingers 29, 30, 34 which are located perpendicular to the direction of propagation of the acoustic waves. Each finger is parallel, equispaced apart and connected to a bus bar. The bus bars serve to transmit, distribute, and sum the electrical signals passing between the input and output leads and the electrode fingers of the transducer.

In FIG. 1 the modulator 18 is connected to the transmitting transducer electrode 22 by two leads which electrically contact the transmitting bus bars 26, 28. In like manner, the bus bars 31, 33 of the receiving transducer are electrically connected to an amplifier 36. This amplifier increases the voltage of the output from the receiving transducer and is used to obtain an electrical signal of sufficient amplitude to display on the oscilloscope 38. The output signal from the amplifier is connected to the vertical input of the oscilloscope and the time based horizontal sweep of the oscilloscope is started by a trigger pulse sent from the nondestructive evaluation system 16.

When the modulator 18, FIG. 1 induces a voltage across the bus bars 26, 28, there is a corresponding electric field generated in the vicinity of the transducer fingers. This electric field varies both in space and with time. Because the surface acoustic wave propagating medium 20 is fabricated from a piezoelectric material, the electric field causes mechanical stresses to be set up in the vicinity of the fingers. These stresses form pulses that propagate through the medium as surface acoustic waves. When the surface acoustic waves arrive at the receiving transducer 24, the waves cause mechanical stresses in the vicinity of the fingers. Because of the piezoelectric effect these mechanical stresses generate electric fields in the piezoelectric material. The electric fields in turn cause charges to be induced in the electrode fingers and a corresponding voltage appears between the bus bars 31, 33 of the receiving transducer.

In order to absorb unwanted surface acoustic waves, two strips 40, 40', FIG. 1 of energy absorbing material are positioned between the transducer electrodes 22, 24 and the margin of the propagating medium 20. This absorbing material dissipates the energy of any incident acoustic waves. A suitable material for absorbing unwanted wave energy is Picein, which is a commercially available product.

In FIG. 1 the transmitting transducer electrode 22 includes two bus bars 26, 28 and one finger pair 29-30. Each finger in the pair is connected to a different bus bar. In the preferred embodiment each finger has a center to center spacing of one half of the acoustic wavelength of the waves propagated in the medium 20. In addition, each finger has a width of one quarter of the acoustic wavelength and there is a gap between each finger of one quarter of the acoustic wavelength. It is this dimensioning and the dimensioning of the receiving transducer 24 hereinafter described which determines the optimum frequency range of the apparatus.

The receiving transducer electrode 24, FIG. 1 extracts the first derivative of the acoustic surface waves propagating in the medium 20 and is more clearly illustrated in FIG. 4. This first derivative transducer includes two opposed bus bars 31, 33 located parallel with the direction of propagation of the acoustic waves. Extending perpendicularly from each bus bar is a plurality of fingers 41-44, inclusive. These fingers are connected to the bus bars in the following sequence ordered in a direction of propagation of the acoustic waves: finger 41 to bus bar 31; finger 42 to bus bar 33; finger 43 to bus bar 33 and finger 44 to bus bar 31. The first two fingers 41, 42 form a finger pair and the second two fingers 43 and 44 form the second finger pair. Between the fingers in each finger pair in FIG. 4 there is a region of overlap of length W as seen by the incident surface acoustic waves. This overlap length W is measured perpendicular to the direction of acoustic wave propagation.

It should be appreciated that the fingers 41-44, inclusive, in the receiving transducer of FIG. 4 are spaced apart so that the electric fields created by the incident surface acoustic waves result in charges being induced in the fingers which add together with the proper phases and produce currents that combine together to produce the desired signal output. In the first derivative transducer, FIG. 4, the fingers have a center to center spacing equal to one half of the acoustic wavelength at the frequency of operation. Each finger has a width of one quarter of the acoustic wavelength and there is a gap getween each finger of one quarter of the acoustic wavelength.

The first derivative transducer 24, FIGS. 1 and 4 operates by using the finite difference approximation to measure the first derivative of the waveform. Each finger pair measures a term required for the approximation. Since the finger pairs are biphase coded and amplitude weighed, as hereinafter described, the proper combination of difference or terms is summed together at the bus bars and an output electrical signal corresponding to the derivative of the waveform is obtained.

To explain the finite difference approximation, a stream of analog data pulses propagating in an acoustic medium can be considered. In this stream of analog data pulses successive pulses having amplitudes $y_k$ pass a reference point at times $t_k$. The finite differences of the pulse amplitudes can be denoted as follows:

$$\Delta Y_k = Y_k - Y_{k-1}, \text{(first difference)} \quad (1)$$

$$\Delta^2(Y_k) = \Delta(\Delta Y_k) = \Delta Y_k - \Delta Y_{k-1}$$

$$= Y_k - 2Y_{k-1} + Y_{k-2}, \text{(second difference)} \quad (2)$$

and $$\Delta^n(Y_k) = \Delta^{n-1} Y_k - \Delta^{n-1} Y_{k-1} \text{(Nth difference)}.$$

If each of the data pulses in the stream is an acoustic wave packet consisting of an RF frequency carrier and is also amplitude modulated by a rectangular function so that the peak amplitudes are $y_{k+1}, Y_k, Y_{k-1}$, etc, then these data pulses can be sensed and measured by using electrode finger pairs. The individually sensed contributions from each finger pair can be added and the amplitude of the contribution weighted by properly designing the finger pairs. The amplitude with which each contribution to the approximation is weighted is linearly proportional to the length W of the overlap region between the adjacent fingers of each pair. By adjusting the overlap length W, the finger pairs can be amplitude weighted. In contrast, the phasing of each contribution is determined by the order in which the fingers are connected to the bus bars. The fingers are biphase coded by connecting the fingers to the bus bars so that the contribution from each finger is either added or subtracted from the total. FIG. 4 illustrates a configuration of finger pairs for producing an output from the data stream corresponding to the first difference (equation 1) and FIG. 5 illustrates a configuration of finger pairs for producing an output proportional to the second difference (equation 2).

The relationship of these differences to the corresponding derivatives can be established from the finite difference approximation to the power series expansion of a function about a point. For a mesh size T it can be shown that the first and second derivatives are approximated by the following equations:

$$\frac{dy}{dt} \sim \frac{y_{k+1} - y_k}{T} \text{ or } \frac{y_k - y_{k-1}}{T} \text{ or } \frac{y_{k+1} - y_{k-1}}{2T} \quad (3)$$

$$\frac{d^2y}{dt^2} \sim \frac{y_{k+1} - 2y_k + y_{k-1}}{T^2} \quad (4).$$

FIG. 2 illustrates an acoustic wave assumed to be incident on the first derivative transducer, FIG. 4. To simplify the illustration, the waveform has been shown as a rectangular, square wave. When the input waveform, FIG. 2, is received by the first derivative transducer, this transducer generates a corresponding response which is illustrated in FIG. 3. It should be appreciated that the first derivative transducer is a spatially distributed device that samples the input waveform and produces no output for a constant input.

FIG. 6 illustrates an apparatus for directly extracting the second derivative from acoustic surface waves. The acoustic waves are generated directly from the returns from a non-destructive material evaluation system (NDE). The second derivative output signals, which are analog in form, are digitized and stored in a digital storage device.

More particularly, the apparatus of FIG. 6 obtains input data directly from a non-destructive evaluation system 16'. This input data is in the form of electrical signals corresponding to the return signals obtained by through either reflection or transmission of a bulk surface wave through the material being tested. The electrical signals from the NDE system are passed directly to the transmitting bus bars 26, 28 hereinbefore described. The transmitting transducer electrode 22 is identical in construction and operation with the transmitting transducer of FIG. 1 hereinbefore described.

In FIG. 6 the acoustic surface waves propagate in a medium 20' which is a non-piezoelectric material. Such materials include fused silica and glass. In order to generate surface acoustic waves in the non-piezoelectric medium 20', a piezoelectric material 44 such as zinc oxide is positioned proximate to the transmitting transducer electrodes 22. The piezoelectric material 44 provides coupling through transduction and thereby generates surface acoustic waves in the propagating medium 20'.

It should be appreciated that the present invention contemplates application with both piezoelectric and non-piezoelectric materials.

The surface acoustic waves propagating in the medium 20', FIG. 6, are incident upon and are sensed by a second derivative transducer 50. The second derivative transducer includes two bus bars 52, 54 at which electrical signals corresponding to the second derivative of the acoustic waves appear. The two bus bars 52, 54 are in turn connected to a conventional analog to digital converter 46. The output signals from the receiving transducer 50 are analog in form and the converter 46 digitizes them. The digital output signals from the converter 46 are then passed to a digital storage device 48. Typically, digital storage devices such as magnetic tape, punch cards, photographic film, and semiconductor memories can be used.

Referring to FIGS. 5 and 6, the second derivative transducer 50 includes two opposed bus bars 52, 54 positioned parallel with the direction of acoustic wave propagation. Connected between the bus bars are three sets of electrode finger pairs 61-62, 63-64 and 65-66. Each finger pair is located perpendicular to the direction of acoustic wave propagation. Each finger is parallel, equispaced apart and connected to a bus bar. In the preferred embodiment, each finger has a center to center spacing of one-half the acoustic wavelength at the frequency of operation, a gap of one-fourth of this wavelength and a width of one-fourth of this wavelength. The fingers of the second derivative transducer are connected to the bus bars in the following sequence ordered in the direction of acoustic wave propagation: finger 61 to bus bar 52, finger 62 to bus bar 54, finger 63 to bus bar 54, finger 64 to bus bar 52, finger 65 to bus bar 52 and finger 66 to bus bar 54.

It should be noted that the first finger pair 61-62, FIG. 5, has a region of overlap of length W measured perpendicular to the direction of propagation of the acoustic waves. In like manner, the second finger pair 63-64 has a region of overlap two W and the third finger pair 65-66 has a region of overlap of length W. These dimensionally varying regions of overlap provide the amplitude weighing for the finite difference approximation hereinbefore described.

The fingers comprising the second derivative transducer, FIG. 5, are biphase coded by connecting the fingers to the bus bars in the sequence and pattern illustrated. Each incident wave front interacts with each finger in turn and a corresponding electrical signal is induced on the associated bus bar. The induced electrical signals on the bus bars are thus phased and either added or subtracted by the pattern of connections between the fingers and the bus bars. It is the aforedescribed biphase coding and amplitude weighting that produces the finite difference approximation to the second derivative expressed in equation 2.

Referring to FIG. 5, it should be appreciated that in practice the region of overlap of the central finger pair 63-64 can be adjusted in length W to eliminate any possible end effect. In the field of surface wave acoustics an end effect can be described as the less efficient operation and lower signal detection experienced with the first and last fingers of an electrode transducer. A similar effect occurs where two adjacent electrodes such as 64 and 65 are connected to the same bus bar. The first and last fingers on a transmitting transducer make less of a contribution to the acoustic wave and on a receiving transducer they induce a smaller signal current. In FIG. 5, these are fingers 61 and 66. The end effect originates because the centrally located fingers are surrounded on both sides by other fingers connected to the other bus bar. Thus, two electric fields are generated on either side of such a finger. This contrasts with the end fingers which are positioned adjacent to only one finger and hence a smaller electric field is induced.

FIG. 7 illustrates an apparatus for propagating surface acoustic waves wherein the RF input signal is obtained from a radiated electromagnetic wave and the fingers in the transmitting transducer are doubled. More particularly, in FIG. 7 a radiated electromagnetic signal such as a radio wave is received on an antenna 70. The antenna is connected to a conventional radio receiver 71 which detects the signal, amplifies it and passes it to a conventional signal mixer 76. A selectable, constant frequency, local oscillator 74 is also connected to the mixer so that the output from the mixer can be adjusted to provide an operating frequency range for which the transducers are dimensioned. The mixer 76 provides an output signal that is equal to either the sum or the difference between the RF signal from the receiver 72 and the constant frequency signal from the local oscillator 74. The input electrical signal from the mixer 76 is passed to the two bus bars 26, 28 hereinbefore described in connection with FIG. 1.

The apparatus of FIG. 7 also includes a surface acoustic wave propagating medium 20 which is fabricated in this embodiment from a piezoelectric material. The transmitting transducer 22', FIG. 7, located on this propagating medium is comparable to the transmitting transducer 22 of FIG. 1; however, the number of finger pairs 29-30 is increased to include a second finger pair 29'-30'. The two sets of transmitting finger pairs are dimensioned and connected to the bus bars 26, 28 in the same manner as hereinbefore described. When the number of transmitting finger pairs is doubled, the number of cycles of acoustic waves generated for each cycle of electrical excitation is likewise doubled. In other words, there are two acoustic wave crests induced in the propagating medium for each maximum reached by the input electrical signal. These crests are spaced apart by a distance equal to the center to center spacing between the fingers 29 and 29'.

The receiving transducer 24', FIG. 7, has the same number of finger pairs as the first derivative transducer, FIG. 4. However, the center to center spacing of the finger pairs has been doubled as compared with the first derivative transducer of FIG. 4. These four fingers are all dimensioned and connected to the bus bars 31, 33 in the same manner as hereinbefore described. The bus bars are in turn connected to a conventional amplifier 36 and an oscilloscope 38 also as hereinbefore described.

By doubling the number of transmitting finger pairs in transducer 22', FIG. 7, this transducer in combination with the receiving transducer 24' can extract the first derivatives of coded signals having two rather than one wave crest per coded symbol. Furthermore, the resultant output signal amplitudes are larger than those which would be produced through the use of the transducer device of FIG. 1.

This can be understood by considering separately the operation of each transducer. At the transmitting transducer 22' when a voltage is briefly applied between bus bars 26 and 28 finger pairs 29–30 and 29'–30' both generate an acoustic wave. Thus a double crested acoustic wave results from excitation by a single voltage pulse. If a second voltage pulse of the same polarity is applied to transducer 22' later when the waves created at finger pairs 29–30 has just propagated to transducer finger pair 29'–30' two more acoustic wave crests are generated which add to the waves created by the first voltage pulse. In this way the wave crest present at finger pair 29'–30' at that moment has twice the amplitude of the wave crest there created by the first pulse. Following through this reasoning with an additional two voltage pulses having negative polarity and spaced from each other and from the second positive polarity voltage pulse by the same time interval that existed between the first and second voltage pulses one can see that the most prominent features of the wave thus produced are two crests spaced by two acoustic wavelengths and having opposites signs and twice the magnitude of the wave crest produced by a single finger pair excited by just one voltage pulse.

When this acoustic signal passes under the receiving transducer 24' at some instant its spaced double amplitude crests excite finger pairs 41–42 and 43–44 simultaneously and in such phase that the currents thereby induced add to produce the maximum output which is proportional to the first derivative of the coded input signal.

Figure 8:
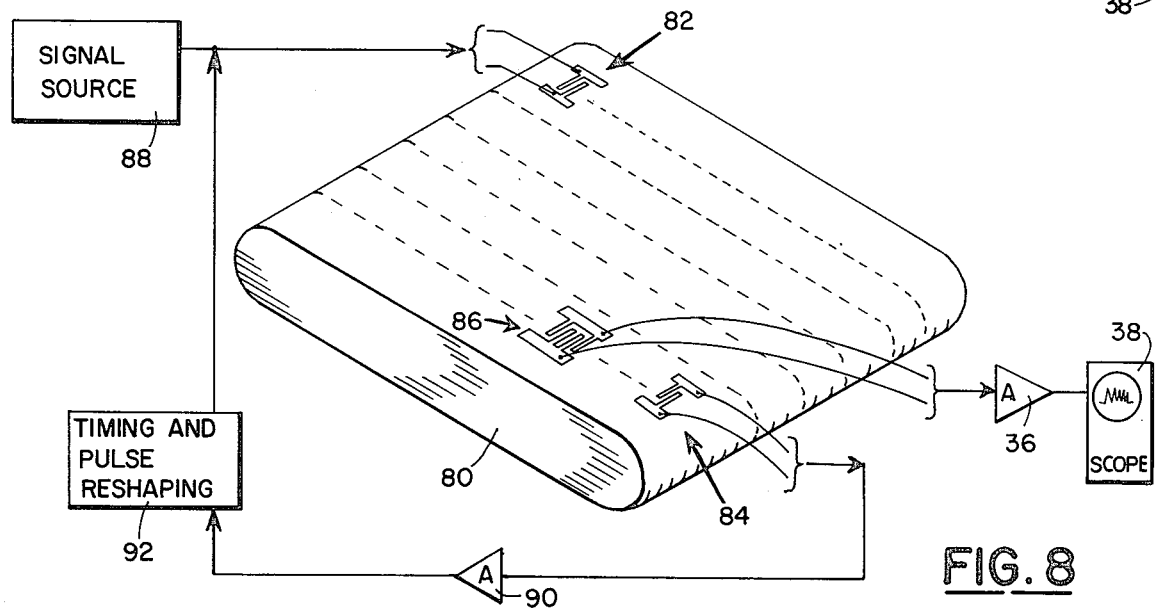
FIG. 8 is a schematic, orthogonal view of an acoustic memory having the first derivative transducer of FIG. 4 therein.

FIG. 8 illustrates a transducer for extracting acoustic wave derivatives which is incorporated into a recirculating acoustic memory. The acoustic memory stores data encoded in acoustic waves and in the preferred embodiment is a wrap-around delay line. The delay line is constructed from a piezoelectric crystal such as bismuth germanium oxide. The crystal has two major, parallel plane faces and terminates at each end into a cylindrically curved surface. The acoustic waves that propagate in the acoustic memory are generated by a transmitting transducer 82. This transmitting transducer is identical in construction and operation to the transmitting transducer 22, FIG. 1 hereinbefore described. The transmitting transducer is slightly angled away from an axis parallel with the edge of the crystal 80 so that the acoustic waves generated therefrom do not follow a reentrant path. The direction of acoustic waves is angled so that the acoustic waves follow the generally helical path indicated in FIG. 8. The acoustic waves thus propagated are received by a receiving transducer electrode 84. This receiving transducer is comparable in construction and operation to the transmitting transducer 82.

Located in the path of the surface acoustic waves propagating in the acoustic memory 80, FIG. 8 is a first derivative transducer 86. This first derivative transducer is identical in construction and operation to the first derivative transducer 24 described in connection with FIG. 1. The output of the transducer 86 is connected to an amplifier 36 and an oscilloscope 38 in the manner hereinbefore described.

The data which is stored in the acoustic memory 80, FIG. 8 is encoded and supplied by a signal source 88. The signal source is connected to the transmitting transducer 82 so that corresponding acoustic waves are generated therefrom. The acoustic waves generated by the transmitting transducer 82 propagate in a generally helical path around the crystal 80. The acoustic waves pass through the first derivative transducer 86, are detected by it and then are subsequently incident on the receiving transducer 84. The receiving transducer 84 converts the acoustic waves into an electrical output. This electrical output is amplified by the amplifier 90 and then is clocked and reshaped in the network 92. The signals from the amplifier 90 are reshaped in order to eliminate the effects of pulse degradation due to transit through the delay line. The network 92 also adjusts the timing of the signals so that the signals are reinserted into the acoustic memory at proper intervals relative to a system clock. The signals from the timing and pulse shaping network are passed to and recirculated into the acoustic memory by the transmitting transducer electrode 82.

The first derivative transducer 86 in the acoustic memory 80, FIG. 8 nondestructively reads out the derivatives of the recirculating data stored in the acoustic memory. The apparatus of FIG. 8 permits the use of a recirculating store as a means of comparing signal returns due to one event and the next subsequent event. In many systems it is the derivative of the input data that is of interest because it is the change and the rate of change in the stored signals which actually represents the information desired. By taking derivatives in this manner one is able to focus on the information content in the stream of data and thereby reduce the amount of data which must be stored.

Figures 9, 10:
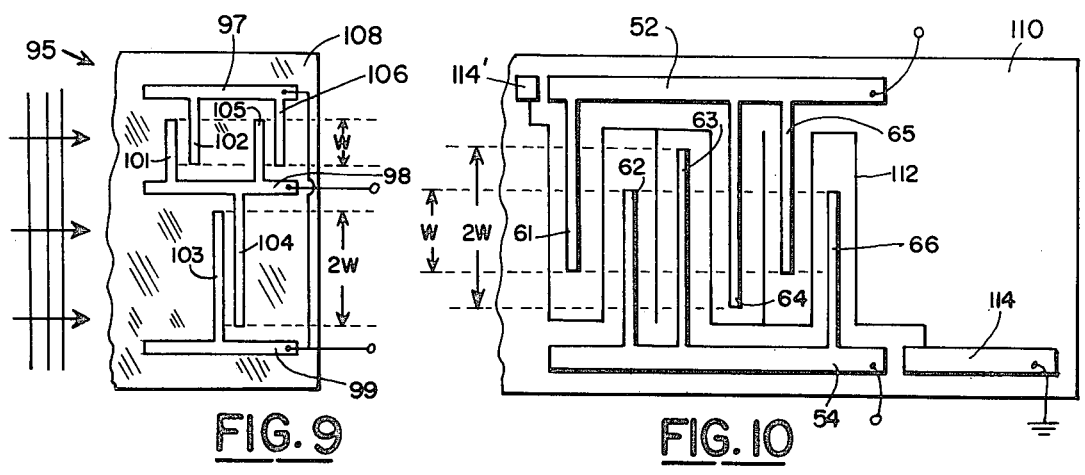
FIG. 9 is a plan view, partially cut away, of an alternative embodiment of a first derivative transducer wherein two propagating channels for the surface acoustic waves are provided.
FIG. 10 is a plan view, partially cut away, of another alternative embodiment of a second derivative transducer wherein a meanderline ground is provided.

FIG. 9 illustrates an alternative embodiment of the present invention wherein two channels of wave propagation are provided in a receiving electrode transducer. The electrode transducer includes three bus bars 97, 98 and 99 which are parallel and oriented in a direction parallel with the direction of propagation of the acoustic surface waves. The electrode transducer further includes three finger pairs 101–102, 103–104, and 105–106, which are located perpendicular to the direction of acoustic wave propagation. Each of the fingers 101–106 is parallel, equi-spaced apart and connected to a bus bar. In the preferred embodiment the center to center spacing between each finger is equal to one half the acoustic wavelength at the frequency of operation of the transducer. Each finger has a width of one quarter the acoustic wavelength and also a gap of one quarter of this wavelength.

The fingers 101–106, FIG. 9 are connected to the bus bars in the following sequence ordered in the direction of propagation of the acoustic waves: finger 101 to bus bar 98, finger 102 to bus bar 97, finger 103 to bus bar 99, finger 104 to bus bar 98, finger 105 to bus bar 98 and finger 106 to bus bar 97. In addition, the first finger pair 101–102 ordered in the direction of acoustic wave propagation has a region of overlap of length W measured in a direction perpendicular to the direction of acoustic wave propagation. In like manner the second finger pair 103–104 has a region of overlap of length 2W and the third finger pair 105–106 has a region of overlap of length W. Accordingly, it can be seen that those finger pairs having a region of overlap of length W are located between bus bars 97 and 98 and that the finger pair 103–104 having a region of overlap of 2W is located between bus bars 98 and 99.

In operation when a broad acoustic wave extending from bus bar 97 to bus bar 98 is incident on the transducer 95, two channels of propagation are formed in the propagating medium 108. One channel extends across the fingers having an overlap length W and the other channel extends across the fingers having an overlap length 2W. Bus bar 97 is electrically connected to bus bar 99 so that the voltages obtained from the fingers having a region of overlap W are combined with the voltages from the fingers having a region of overlap of length 2W.

The arrangement of fingers 101–106 in FIG. 9 serves to eliminate diffraction of the incident acoustic waves by presenting in each propagating channel only those fingers having the same length of overlap.

Heretofore acoustic wave diffraction experienced with transducers was caused by different parts of the acoustic wave front experiencing different environments in the propagating medium. In a typical situation an acoustic surface wave propagates through a medium with a uniform phase velocity and with a wave front that remains planar. However, when the acoustic wave is incident on a finger electrode, the phase velocity of the wave changes. This change in phase velocity occurs because the finger has a metallic surface. Typically, the phase velocity is less in the region of such metallic surfaces. Accordingly, if the surface acoustic wave has portions which are slowed down by finger electrodes and other portions which are not slowed down, the uniform planar wave front is diffracted. The transducer illustrated in FIG. 9 avoids this type of diffraction by presenting in each propagation channel electrode fingers having the same length of overlap. Thus, the acoustic waves see a uniform finger width in a channel and the wave front in the channel remains planar.

FIG. 10 illustrates an alternative embodiment of the present invention wherein the transducer electrode eliminates end effects and interference between adjacent fingers. In particular, this transducer electrode is the second derivative transducer hereinbefore described in connection with FIGS. 5 and 6. The arrangement of bus bars and finger pairs is identical and the mode of operation is principally the same. The transducer electrode is deposited on an acoustic surface wave propagating medium 110. This transducer further includes a meanderline ground 112 which is also deposited on the medium 110 and electrically isolates each finger. The meanderline ground extends between the two grounded pads 114, 114' and meanders in between the fingers essentially to divide the channel of acoustic wave propagation into individual cells. The meanderline ground is typically fabricated at the same time and from the same material as the electrode fingers; however the meanderline ground has a much narrower width.

By using the meanderline ground electrode 112, FIG. 10, the third finger 63, for example, senses only the acoustic field within its cell. This cell is formed by the boundary of the meanderline around the finger. The electric charge that is induced in this third finger is thus isolated and independent from the charge induced in the second finger 63 and the fourth finger 64. Hence, the less efficient operation and lower signal detection capability of the first and last fingers are balanced out with the centrally located fingers.

FIGS. 11, 12, and 13 illustrate an alternative embodiment of the present invention wherein one array of transducer fingers can extract on command with the first, second or higher order of derivative. The fingers are selectively connectible to differing weighting networks so that the finite difference approximation can be accomplished for derivatives of any order without changing the position and/or the size of the fingers.

More particularly, in FIG. 1 reference numeral 120 indicates an acoustic surface wave propagating medium. In the preferred embodiment this medium is fabricated from silicon so that the apparatus is compatible with conventional integrated circuit devices (not shown). The surface acoustic waves are generated in the medium by a transmitting transducer 122. This transmitting transducer is similar in constructing and operation to the transmitting transducer 22, FIG. 1 hereinbefore described. The transmitting transducer is driven by RF signals from a source not shown. An overlying film of piezoelectric material 124 induces the acoustic surface waves in the medium 120 through transduction. Typically, this film can be fabricated from zinc oxide. The film is constructed and operates in the same manner as the zinc oxide film hereinbefore discussed in connecting with FIG. 6.

The acoustic waves propagated in the apparatus of FIG. 11 are incident on a plurality of finger electrodes 131–140, inclusive. These finger electrodes underlie the piezoelectric film 124 and are parallel, equispaced apart and located perpendicular to the direction of acoustic wave propagation. The fingers are constructed and deposited on the propagating medium in the same manner as hereinbefore described. Each individual finger electrode has a center to center spacing equal to one-half of the acoustic wavelength at the frequency of operation and a width and gap of one-quarter of the acoustic wavelength.

It should be noted that each finger electrode 131–140, FIG. 11, extends beyond the boundary of the overlying piezoelectric film 124 and the length of the overlap region between each finger electrode is the uniform. In addition, fingers 132, 134, 136, 138 and 140 are connected to a common bus bar 142. This bus bar is oriented parallel to the direction of propagation of the acoustic waves and serves as one of the outputs for the apparatus. The apparatus also includes a tapered absorber 150. The acoustic waves after passing through electrode fingers 131–140 are absorbed in this absorber. The absorber has a high coefficient of acoustic wave absorption and is typically fabricated from Picein.

The electrode fingers 131, 133, 135, 137 and 139, FIG. 11, are each individually connected to a separate, commandable weighting network 144–148. Each weighting network $W_1$–$W_5$ includes a small, identical integrated circuit incorporated into the silicon substrate 120. These networks provide on command selectable amplification, inversion and termination of the signal supplied to their inputs by the electrode fingers. In network 145, FIG.

12, there is amplification by a factor of A and in network 145, FIG. 13, there is amplification by a factor of 2A. Inversion occurs in networks 145, FIGS. 12, 13, where there is amplification by a factor −1. Signal termination is shown in networks 146-148, FIG. 12. The weighting networks are controlled and commanded by a tap control network 154. In the preferred embodiment, the weighting networks 146-148 are transistor networks and the tap control 154 programs each network by applying an appropriate bias voltage to the proper transistors within each network.

To provide commandable bias voltages, the tap control 154, FIG. 11, includes a diode switching matrix. The output bias voltages from the tap control are selected by signals which are applied to the electrodes 156, 158 and 160. The biases for the first derivative, for example, are selected by applying a signal to pad 156. This signal in turn causes the tap control to bias each weighting network to form the circuit illustrated in FIG. 12. In like manner, when a signal is applied to pad 158, the tap control biases each weighting network to form the circuits illustrated in FIG. 13. This combination of circuits extracts the second derivative of the acoustic waves. In like manner, the third derivative is commanded by a signal applied to tap 160.

Thus, it can be seen that any desired derivative can be extracted from the acoustic waves incident on the electrode fingers. The weighting networks through signal inversion, selectable amplification, and termination can induce between the bus bars 142, 152 any signal required for the finite difference approximation.

In addition, the weighting networks can be designed to compensate for end effects by providing amplification factors slightly different from integral multiples of each other. Alternatively the meanderline ground can be used to eliminate end effects as indicated earlier in FIG. 10.

It is also contemplated within the scope of the present invention to construct the weighting networks 144-148, FIG. 11, to include transistor amplifiers and programmable switching circuits. In such networks each transistor is biased and the tap control 154 switches the input signals from the fingers so that these signals are only directed through designated, predetermined transistors. Thus, the desired derivative is selected by redirecting the signal flow through the weighting networks.

Further, it is contemplated within the scope of the present invention to attach every finger electrode 131-140. FIG. 11, to a weighting network. This contrasts with the embodiment of FIG. 11 wherein only alternate fingers are connected to the weighting networks. When the entire array of finger electrodes is connected to weighting networks, each finger electrode 131-140 is spaced appart by a center to center distance of one acoustic wavelength. The fingers of the transmitting transducer 122, however, remain spaced apart by a center to center distance of one-half the acoustic wavelength. The width of all of the fingers remains one-quarter of the acoustic wavelength.

With every finger attached to a weighting network, the second derivative, for example, can be extracted by applying an amplification of A to the signal sensed by the first finger electrode 131. The second finger electrode 132 is connected to a weighting network (not shown) which provides both signal inversion (−1) and amplification by a factor of 2A. The third finger electrode 133 is connected to a weigthing network that amplifies the signal by a factor of A. The outputs of these three aforedescribed weighting networks are combined and appear as output voltages on the bus bar 152.

It is further contemplated within the scope of the present invention to provide duplicate weighting networks and a second tap control network to the apparatus of FIG. 11. These weighting networks and associated tap control would replace the bus bar 142 and would permit the simultaneous extraction of two different derivatives from the acoustic waves.

It also is contemplated that although specific RF signal sources for driving the transmitting transducers have been illustrated and described, other signal sources can be used. In like manner the electrical analog output signals from the receiving transducers can be processed, stored, and displayed by means other than those described herein. In addition, although the first and second derivative transduers, FIGS. 4 and 5, are illustrated and described in connection with specific acoustic wave transmitting media and specific input and output applications, these transducers are fully interchangeable and their use is determined only by the derivative desired to be obtained.

Additionally and more importantly, although only first and second derivative transducers have been described and illustrated herein, it is contemplated within the scope of the present invention to extract derivatives of a third and higher order. These higher order derivatives are obtained by using the same finite difference approximation. The amplitude weighing and biphase coding required for the electrode fingers is expressed by equation 3.

Thus, although the best modes contemplated for carrying out the present invention have been herein shown and described, it will be apparent that modification and variation may be made without departing from what is regarded to be the subject matter of the invention.

What is claimed is:
1. An apparatus for extracting the second derivative from an acoustic wave, comprising:
   a first bus bar;
   a second bus bar spaced apart from said first bus bar;
   three pairs of parallel fingers coupled to a piezoelectric material and oriented transversely to the direction of travel of the acoustic waves, and wherein the first, fourth, and fifth fingers are coupled to said first bus bar and the second, third, and sixth fingers are coupled to said second bus bar, the center-to-center spacing of the fingers in each pair is equal to one-half the acoustic wavelength, and the end portions of the outer pairs each overlap by an equal amount, and the end portions of the inner pair overlap by an amount equal to two times said equal amount of overlap of said outer pairs, whereby the amplitude contribution of each pair is weighted by an amount equal to the amount of overlap of said fingers in each pair and the difference in amplitude contribution between said outer pairs and said inner pairs is obtained so that the second derivative is extracted from the acoustic wave according to the finite difference approximation of the pulse amplitudes, as follows:

$$\Delta^2 Y_k = Y_k - 2Y_{K-1} + Y_{k-2},$$

wherein $Y_k$ equals the amplitude of the acoustic wave passing a reference point at time $k$.

2. The apparatus as claimed in claim 1, wherein each of said fingers has a width equal to one-fourth the acoustic wavelength and there is a gap between each finger in said pair of one-fourth of the acoustic wavelength.

3. The apparatus as claimed in claim 1, including:
an amplifier coupled to said first and second bus bars; and
a display means coupled to said amplifier, whereby the second derivative from an acoustic wave is displayed.

4. The apparatus as claimed in claim 1, including:
a signal storage means coupled to said first and second bus bars, whereby the second derivative extracted from said acoustic wave is stored.

5. An apparatus for extracting derivatives of the $n^{th}$ order from an acoustic wave, where $n$ is any real, positive integer greater than 1 comprising:
a first bus bar;
a second bus bar spaced from said first bus bar;
pairs of overlapping parallel fingers coupled to a piezoelectric material and oriented transversely to the direction of travel of the acoustic wave, one finger of each pair extending from said first bus bar and the other finger extending from said second bus bar, the center-to-center spacing of said fingers in each pair being equal to one-half the acoustic wavelength; and
means for weighting said pairs of fingers according to the finite difference approximation series;

$$\Delta^n Y_k = \Delta^{n-1} Y_k - \Delta^{n-1} Y_{k-1},$$

wherein $n$ = the derivative being extracted and $Y_k$ = the amplitude of the acoustic wave passing a reference point at time $k$, and
wherein the number of pairs of fingers contributing a signal is equal to the number of terms in said series, the weight given to each contributing pair is an integral multiple equal to the coefficient of the respective term in said series, and the phase of the contributing pair is the same as the sign of said coefficient, whereby a signal equal to the $n^{th}$ derivative of the acoustic wave is obtained from said bus bars.

6. The apparatus as claimed in claim 5, wherein said means for weighting comprises the length of the overlap between said fingers in each pair, said length of said overlap being directly proportional to the weight given to each contributing pair; and wherein said leading fingers, with respect to the acoustic wave, of each of said pairs extends from said first bus bar when said coefficient is negative and from said second bus bar when said coefficient is positive to establish said phase.

7. The apparatus as claimed in claim 5, wherein said first bus bar comprises two electrically coupled parts, a first part on one side of said second bar and a second part on the other side of said second bus bar.

8. An apparatus for extracting derivatives of the $n^{th}$ order from an acoustic wave, where $n$ is any real, positive integer greater than 1, comprising:
a first bus bar;
a second bus bar spaced apart from said first bus bar; and
pairs of parallel fingers coupled to a piezoelectric material and oriented transversely to the direction of travel of the acoustic wave, one finger of each pair extending from said first bus bar and the other finger extending from said second bus bar, the center-to-center spacing of said fingers in each pair being equal to one-half the acoustic wavelength, the end portions of said fingers in each pair overlapping by an integral multiple of the minimum overlap of said fingers in any pair, the geometrical relationship of said pairs being governed by the series:

$$\Delta^n Y_k = \Delta^{n-1} Y_k - \Delta^{n-1} Y_{k-1},$$

wherein $n$ = the derivative being extracted and $Y_k$ = the amplitude of the acoustic wave passing a reference point at time $k$, and
wherein the number of pairs of fingers in the apparatus is equal to the number of terms in said series, said integral multiple of overlap for each pair is equal to the coefficient of the respective term in said series, and the leading finger, with respect to the acoustic wave, of each of said pairs extends from said first bus bar when said coefficient is positive, whereby the amplitude contribution of each pair is weighted by said overlap and either added or subtracted from the derivative depending upon the sequence of connection of each finger in said pairs to said bus bars.

* * * * *